United States Patent [19]
Le et al.

[11] Patent Number: 5,821,800
[45] Date of Patent: Oct. 13, 1998

[54] HIGH-VOLTAGE CMOS LEVEL SHIFTER

[75] Inventors: Binh Quang Le, Santa Clara; Shoichi Kawamura, Sunnyvale; Pau-Ling Chen, Saratoga; Shane Hollmer, San Jose, all of Calif.

[73] Assignee: Advanced Micro Devices, Inc., Sunnyvale, Calif.

[21] Appl. No.: 799,074

[22] Filed: Feb. 11, 1997

[51] Int. Cl.$^6$ .......................... H03K 1/175; H03K 19/003
[52] U.S. Cl. ............................ 327/333; 327/437; 326/62; 326/81; 326/68
[58] Field of Search .................................. 326/62, 63, 68, 326/80, 81; 327/333, 77, 530, 437, 306

[56] References Cited

U.S. PATENT DOCUMENTS

| | | | |
|---|---|---|---|
| 4,490,629 | 12/1984 | Barlow et al. | 307/451 |
| 5,406,141 | 4/1995 | Yero et al. | 326/68 |
| 5,510,748 | 4/1996 | Erhart et al. | 327/333 |
| 5,539,334 | 7/1996 | Clapp, III et al. | 326/68 |
| 5,559,464 | 9/1996 | Orii et al. | 327/333 |
| 5,598,106 | 1/1997 | Kawasaki et al. | 326/21 |

FOREIGN PATENT DOCUMENTS

| | | | |
|---|---|---|---|
| 000388074 | 9/1990 | European Pat. Off. | 327/333 |

*Primary Examiner*—Tim Callahan
*Assistant Examiner*—Dinh Le
*Attorney, Agent, or Firm*—Fliesler, Dubb, Meyer & Lovejoy

[57] ABSTRACT

A high-voltage level shifter includes one or more complementary NMOS/PMOS series intermediate transistor pairs to divide the high-voltage supply range into two or more sub-ranges. The level shifter has a differential structure with complementary NMOS input transistors. Cross-coupled PMOS output transistors provide complementary outputs. The complementary NMOS/PMOS series intermediate transistor pairs separate the NMOS input transistor drains from the PMOS output transistor drains. In order to divide the high voltage range into h subranges, h-1 complementary NMOS/PMOS series intermediate transistor pairs are used each being biased by monotonically increasing fixed intermediate voltages. In a shared-bias embodiment, each complementary NMOS/PMOS series intermediate transistor pair is biased by a single corresponding intermediate voltage. In a split-bias embodiment, each complementary NMOS/PMOS series intermediate transistor pair is biased by a corresponding NMOS bias voltage and a corresponding PMOS bias voltage, in which the NMOS bias voltage is higher than the PMOS bias voltage by the sum or the NMOS threshold voltage and the PMOS threshold voltage. In another aspect, the N-wells of the PMOS transistors are tied to an upwardly vertically adjacent intermediate voltage in the shared-bias embodiments, and are tied to an upwardly vertically adjacent NMOS bias voltage in the split-bias embodiments. In a twin tub embodiment for very high voltage applications, the P-wells of the NMOS transistors are tied to a downwardly vertically adjacent intermediate voltage in the shared-bias embodiments, and are tied to a downwardly vertically adjacent PMOS bias voltage for the split-bias embodiments.

17 Claims, 6 Drawing Sheets

HIGH-VOLTAGE CMOS LEVEL SHIFTER

BACKGROUND OF THE INVENTION

1. Field of the Invention

The present invention relates to the field of high-voltage CMOS circuits. Specifically, the present invention relates to level shifter circuits having complementary low-voltage inputs and complementary high voltage outputs.

2. Discussion of the Related Art

Due to device limitations, the conventional circuits for high-voltage operations never switched when the high voltage was present; thus, the circuits were incapable of changing state when the high voltage was applied to the circuits. The specific device parameters which limit conventional circuits ability to handle high voltage are the oxide breakdown voltage, junction breakdown voltage, and the hot switching voltage.

The oxide breakdown voltage is the gate to source or gate to drain voltage at which the gate oxide ruptures. The dielectric breakdown strength for $SiO_2$ is about $8 \times 10^6$ Volts per centimeter. For modern device gate oxide thicknesses of about 150 Angstroms, the gate oxide breakdown voltage is only about 12 Volts.

The junction breakdown voltage is the level of reverse bias between the drain or source and the well or substrate at which the reverse-biased diode junction used for electrical isolation of the drain or source breaks down due to avalanching or Zener behavior. A "donut" transistor's gate partially overlaps its drain, source, or drain and source. In operation, a voltage within a specified voltage range is applied to the gate of the donut transistor. The presence of the overlying gate in a donut transistor typically reduces the peak electric field intensity in the depletion regions of the reverse biased diode junction from the higher peak electric field intensities which would otherwise exist in the absence of the overlying gate. Therefore, the donut transistors are able to sustain a higher level of reverse bias between the source or drain and the well or substrate before junction breakdown occurs. For typical modern device parameters, the junction breakdown voltage for a donut transistor having 10 volt gate to substrate voltage is about 15 Volts while the junction breakdown voltage for a standard transistor is about 10 Volts. At this gate voltage level, as the gate voltage rises, the junction breakdown voltage increases approximately linearly with the gate voltage by a factor of about 1.0 times the gate to substrate voltage.

Hot switching occurs when a transistor changes its conduction state in the presence of an excessively large drain to source voltage. If the transistor changes from OFF to ON, or from ON to OFF, in the presence of a high drain to source voltage, a parasitic bipolar transistor may be activated which can damage the device. For modern devices, the hot switching drain to source voltage limitation $V_{hsl}$ is about 7 Volts. The hot switching drain to source voltage limitation $V_{hsl}$ is dependent upon many technological parameters.

Because the 7 volt limitation for avoiding hot switching is the lowest of the three limitations described above, the constraint that it presents is the most difficult to satisfy.

Figure 1:
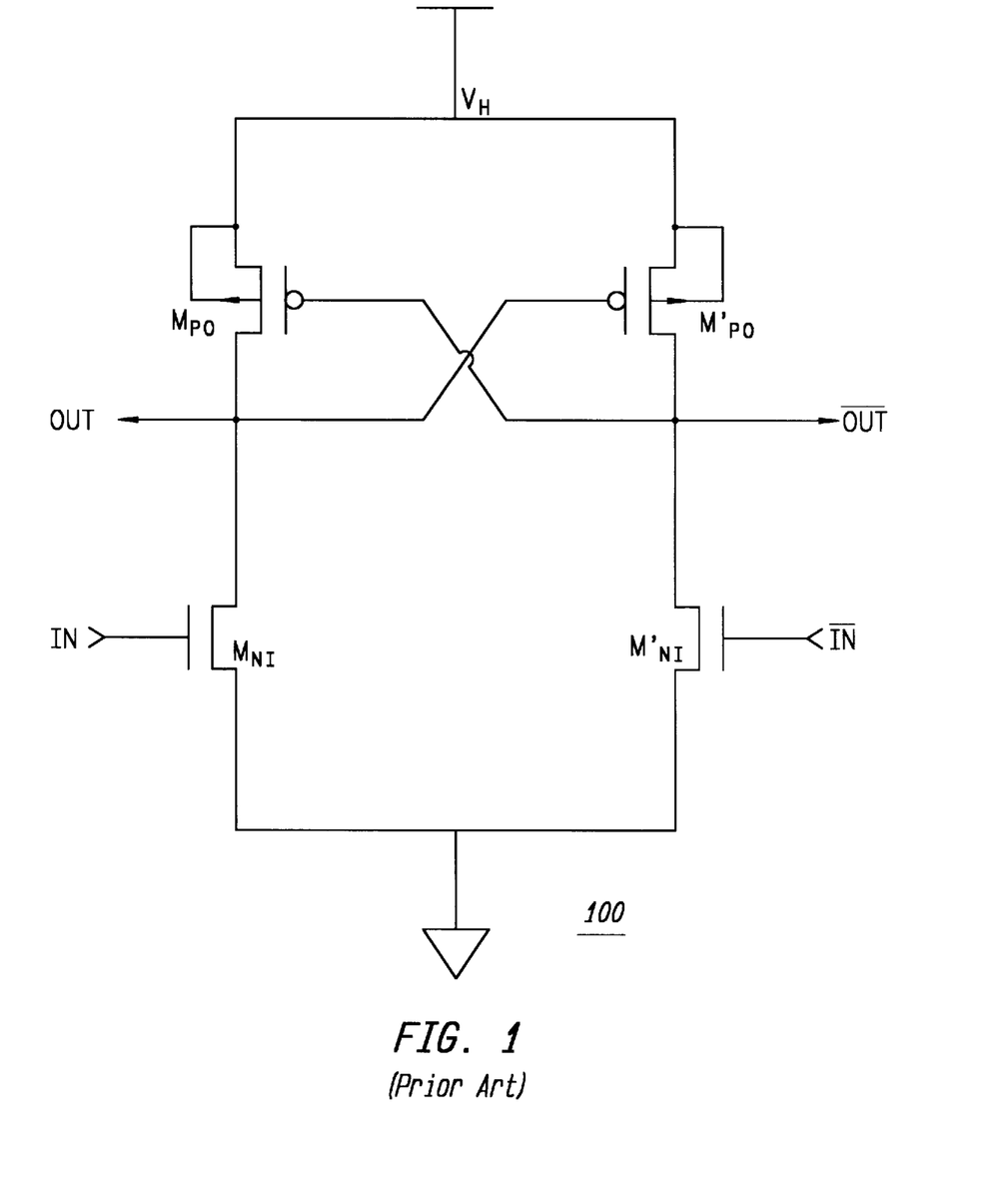
FIG. 1 illustrates a conventional low-voltage level shifter having complementary inputs and differential outputs.

FIG. 1 illustrates a conventional low voltage level shifter. There are two complimentary inputs IN and $\overline{IN}$ and two complementary outputs OUT and $\overline{OUT}$. When input IN is high and inverted input $\overline{IN}$ is low, the output OUT is driven low by transistor $M_{NI}$, and the inverted output $\overline{OUT}$ is driven high by transistor $M_{PO}'$. When input IN is low and inverted input $\overline{IN}$ is high, the inverted output $\overline{OUT}$ is pulled low by transistor $M_{NI}'$, and the output OUT is pulled high by transistor $M_{PO}'$. When both inputs are low, the switch outputs OUT and $\overline{OUT}$ maintain their previous state. If the supply voltage $V_H$ exceeds the hot switching limitation $V_{hsl}$, then the conventional switch 100 will become unreliable.

Table 1 below shows the node voltages of the circuit 100 of FIG. 1 corresponding to the two input states. The source to drain voltage of output transistor $M_{PO}$ is 12 Volts and the drain to source voltage of input transistor $M_{NI}'$ is 12 Volts when the input IN is high and the input $\overline{IN}$ is low. If the inputs then change states so that IN is low and $\overline{IN}$ is high, hot switching occurs in transistors $M_{PO}$ and $M_{NI}'$. Upon changing input states again, hot switching occurs in transistors $M_{PO}'$ and $M_{NI}$. Thus, hot switching occurs in all transistors of the circuit 100 of FIG. 1 when the supply voltage exceeds the hot switching threshold.

TABLE 1

| VOLTAGE | IN > $V_{TNI}$<br>$\overline{IN}$ < $V_{TNI}$ | IN < $V_{TNI}$<br>$\overline{IN}$ > $V_{TNI}$ |
| --- | --- | --- |
| $V_H$ | 12 | 12 |
| OUT | 0 | 12 |
| GND | 0 | 0 |
| $V_H$ | 12 | 12 |
| $\overline{OUT}$ | 12 | 0 |
| GND | 0 | 0 |

As is apparent from the above discussion, a need exists for a high-voltage CMOS level shifter which allows switching to occur during high-voltage operation without violating the hot-switching threshold limitation, the junction breakdown limitation, or the oxide breakdown limitation.

SUMMARY OF THE INVENTION

Conventional high voltage level shifters were not able to switch states while operating under the high voltage conditions because the hot switching threshold constraint would be violated under these circumstances. The oxide breakdown voltage constraint and the junction breakdown voltage constraint also limited the feasible high voltage circuit designs. Thus, an object of the present invention is to provide a high voltage level shifter which does not violate either the hot switching, the oxide breakdown, or the junction breakdown constraints. Another object of the present invention is to provide a high voltage level shifter which minimizes circuit area and switching time. Yet another object of the present invention is to provide a high voltage level shifter structure which can be extended to accommodate very high supply voltages.

According to the present invention, one or more complementary NMOS/PMOS series intermediate transistor pairs separate the output nodes from the input pulldown transistors, so that the high supply voltage range $V_H$ is separated into several sub-ranges. Each complementary NMOS/PMOS series intermediate transistor pair includes one NMOS and one PMOS transistor connected in series for each side of the cross-coupled differential level shifter structure. This reduces the voltage swings of internal nodes, thereby preventing excessive drain to source voltages from occurring and preventing hot-switching from occurring.

In a shared-bias embodiment, the gates of all four transistors in each complementary NMOS/PMOS series intermediate transistor pair are biased by a fixed intermediate voltage. These fixed intermediate voltages represent the boundaries between each of the several voltage sub-ranges. Because both the N-type and P-type intermediate transistors for a given complementary NMOS/PMOS series intermediate transistor pair are biased by the same intermediate voltage, the voltage swings at the sources of the complementary NMOS/PMOS series intermediate transistor pair are reduced by the threshold voltages of the intermediate NMOS and PMOS voltages. If the high voltage supply range is divided into h sub-ranges, only h-1 intermediate voltages are required.

In a split-bias embodiment, two separate intermediate bias voltages are used to bias the gates of each complementary NMOS/PMOS series intermediate transistor pair. In each complementary NMOS/PMOS series intermediate transistor pair, the two NMOS transistors' gates are biased by a corresponding NMOS bias voltage, and the two PMOS transistors' gates are biased by a corresponding PMOS bias voltage. Thus, in order to divide the high voltage supply range into h sub-ranges, 2*(h-1) intermediate voltages are required according to the split-bias embodiment. For a given complementary NMOS/PMOS series intermediate transistor pair, the NMOS bias voltage exceeds the PMOS bias voltage by two threshold voltages. This allows the maximum voltage swing within each sub-range at the sources of each complementary NMOS/PMOS series intermediate transistor pair. Because the voltage swings are maximized, the current carrying capacity of each NMOS/PMOS series intermediate transistor pair is maximized. For a given area, the switching time of the level shifter is minimized.

According to another aspect of the present invention, N-wells for isolating the PMOS intermediate transistors are tied to upwardly vertically adjacent intermediate voltages for the shared bias embodiment and are tied to upwardly vertically adjacent NMOS bias voltages for the split bias embodiment. In a twin-tub embodiment suitable for use in very high voltage applications, the P-wells for isolating the NMOS intermediate transistors are tied to the downwardly vertically adjacent intermediate voltages for the shared bias embodiment are are tied to downwardly vertically adjacent PMOS bias voltages for the split bias embodiment. This control over the bodies of both the NMOS and PMOS intermediate transistors minimizes the body effect for all intermediate transistors and eliminates the possibility of junction breakdown.

These and other features and advantages of the present invention will be apparent from the Figures as fully explained in the Detailed Description of the Invention.

The Figures are fully explained in the Detailed Description of the Invention.

DETAILED DESCRIPTION OF THE INVENTION

Conventional high-voltage level shifters were unable to switch states when the high voltage supply was present without violating the hot-switching limitation of the technology. The high voltage level shifter according to the present invention was first invented for NAND flash memory applications. NAND flash memory typically requires unusually high voltages for programming and erase operations. The high voltage level shifter according to the present invention can also be applied to other flash technologies and other high voltage circuits. The present invention is particularly well-suited for operation in high-voltage CMOS circuits.

Figure 2:
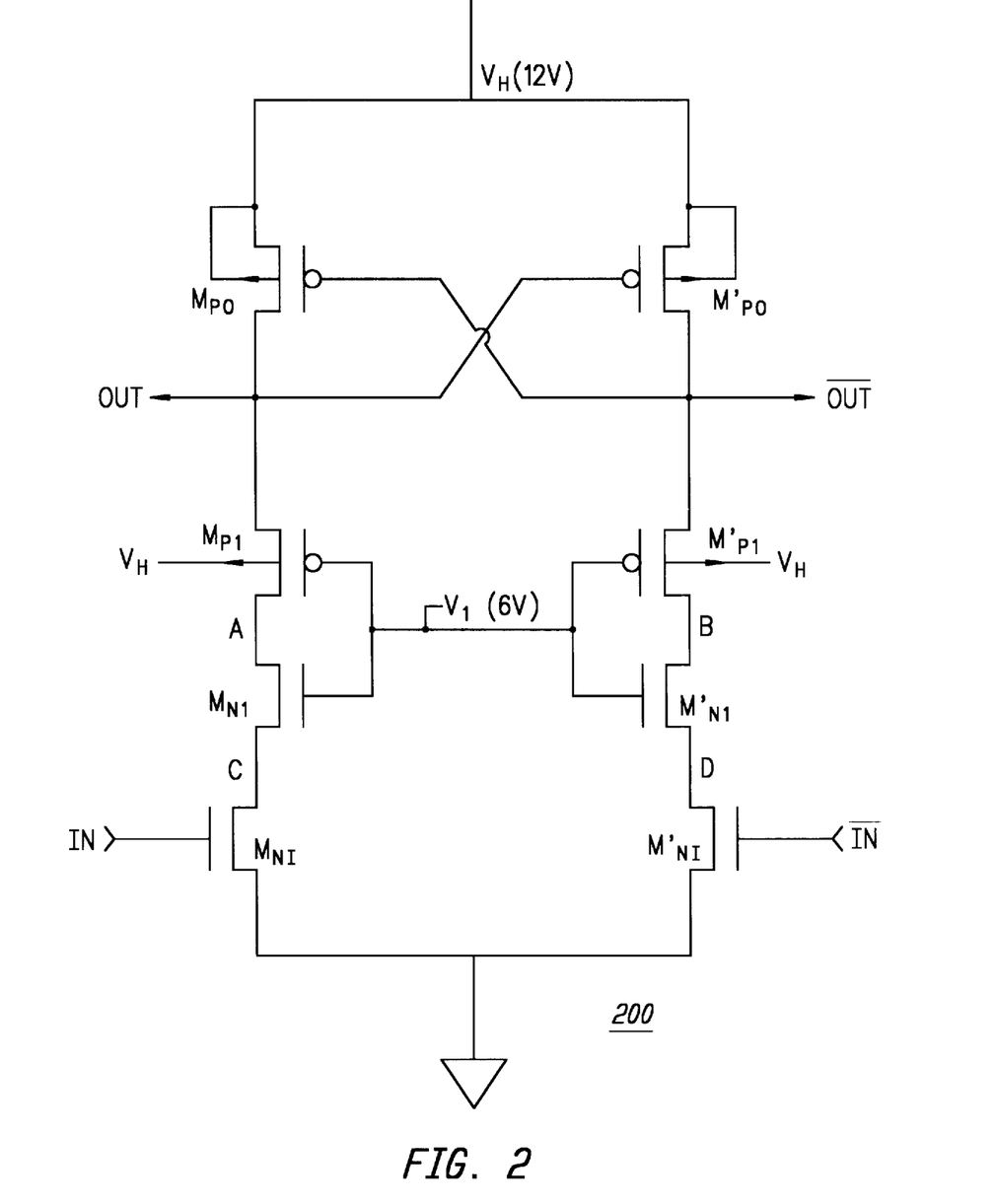
FIG. 2 illustrates a shared-bias embodiment of a high-voltage level shifter according to the present invention having two voltage sub-ranges, one complementary NMOS/PMOS series intermediate transistor pair, and one intermediate voltage.

FIG. 2 illustrates a simple embodiment 200 of the present invention. In the circuit 200 according to the present invention, the high supply voltage $V_h$ is 12 Volts. The 12 Volt $V_h$ is divided into two subranges by the intermediate voltage $V_1$, which is 6 Volts. A pair of additional transistors $M_{N1}$ and $M_{P1}$ separate the output node OUT from the input transistor $M_{NI}$. Similarly, a pair of additional transistors $M_{N1}'$ and $M_{P1}'$ separate the inverted output node $\overline{OUT}$ from the inverting input transistor $M_{NI}'$. Table 2 below shows the node voltages for the circuit 200 of FIG. 2 if the absolute value of the threshold voltages for all intermediate transistors $M_{P1}$, $M_{N1}$, $M_{P1}'$, and $M_{N1}'$ are equal and are only 1 volt. The voltages in each column represent the drain and source voltages of each of the transistors in FIG. 2. Therefore, the difference between any two vertically adjacent numbers in Table 2 represents the source to drain or drain to source voltage of a transistor in FIG. 2. Because no two vertically adjacent numbers in Table 2 differ by more than 7 Volts, hot switching is avoided in the circuit 200 of FIG. 2.

TABLE 2

| VOLTAGE | IN > $V_{TNI}$<br>$\overline{IN}$ < $V_{TNI}$ | IN < $V_{TNI}$<br>$\overline{IN}$ > $V_{TNI}$ |
| --- | --- | --- |
| $V_H$ | 12 | 12 |
| OUT | 7 | 12 |
| A | 0 | 12 |
| C | 0 | 5 |
| GND | 0 | 0 |
| $V_H$ | 12 | 12 |
| $\overline{OUT}$ | 12 | 7 |
| B | 12 | 0 |
| D | 5 | 0 |
| GND | 0 | 0 |

Figure 3:
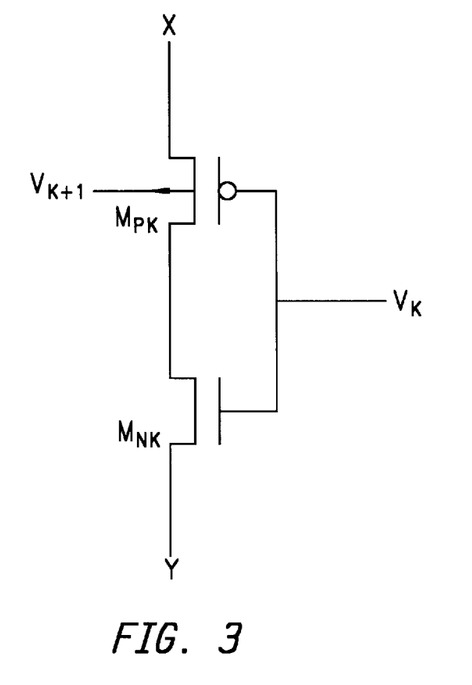
FIG. 3 illustrates an NMOS/PMOS series intermediate transistor pair for use in the shared-bias embodiment of a high-voltage level shifter according to the present invention.

FIG. 3 illustrates the circuit structure for separating voltage ranges according to the present invention. If node X is being pulled up and node Y is floating at an initial voltage $V_y$ which is less than $V_K$, then $V_y$ can never exceed a $V_K-V_{tNK}$, where $V_{tNK}$ is the threshold voltage of NMOS transistor $M_{NK}$, even if node X is pulled up by a strong device. Similarly, if node X is floating, $V_x$ can never be pulled lower than $V_K+V_{tPK}$, where $V_{tPK}$ is the absolute value of the threshold voltage of PMOS transistor $M_{PK}$, even if node Y is pulled down by a strong device. PMOS transistor $M_{PK}$ will cut off when node Y is pulled low; NMOS transistor $M_{NK}$ will cut off when node X is pulled high. This electrical isolation is exactly what is needed to divide the large voltage range $V_H$ into two or more smaller voltage ranges. The intermediate voltage $V_K$ sets the lower limit for the higher voltage node X at $V_K+V_{tPK}$ and set the upper limit for the lower voltage node Y at $V_K-V_{tNK}$.

Figure 4:
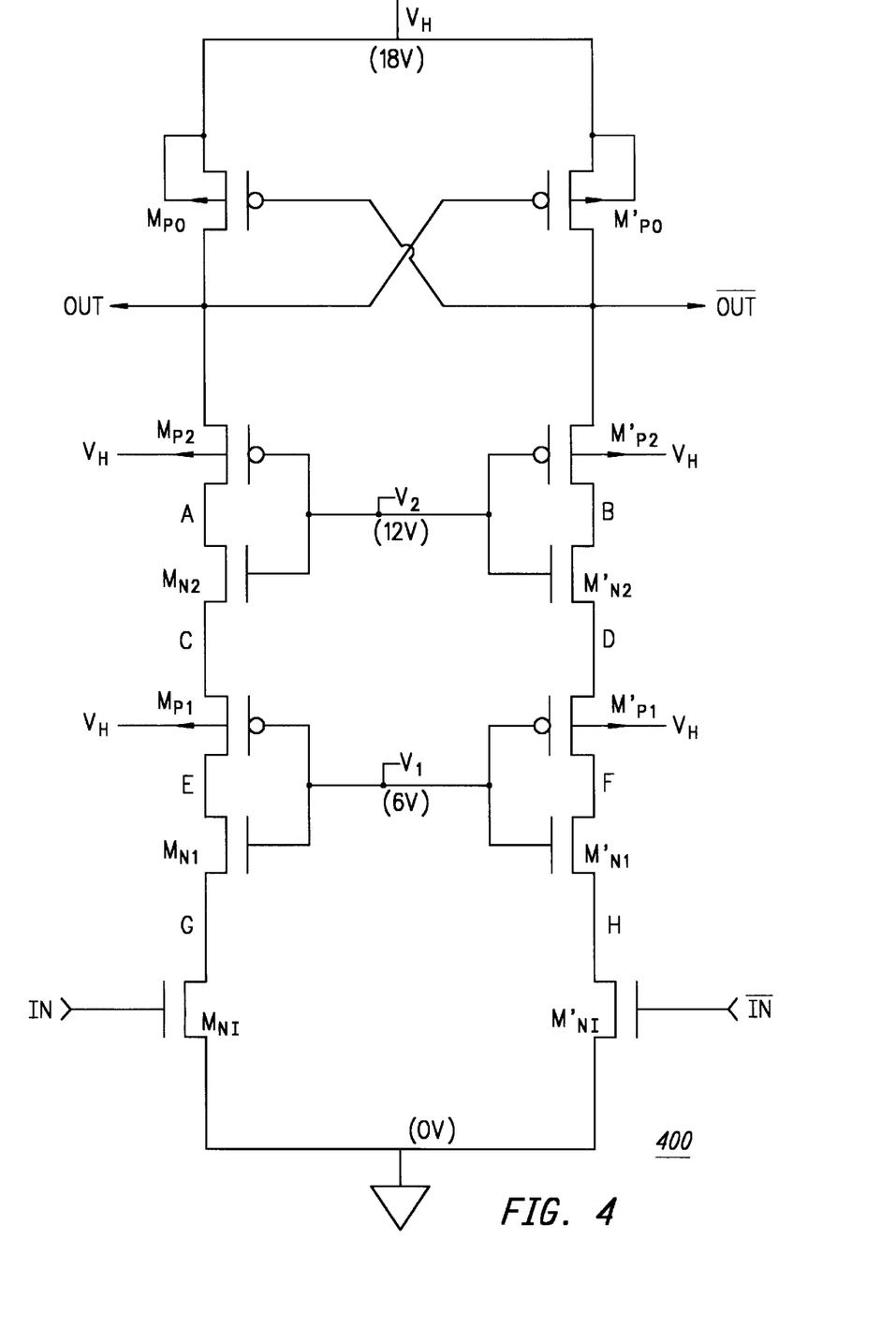
FIG. 4 illustrates a shared-bias embodiment of a high-voltage level shifter according to the present invention having three voltage sub-ranges, two complementary NMOS/PMOS series intermediate transistor pairs, and two intermediate bias voltages.

FIG. 4 illustrates the extension of the electrical isolation circuit to three different voltage subranges to handle a high voltage supply $V_H$ of 18 Volts. Two intermediate voltages $V_1$ and $V_2$ are spaced evenly in the 18 Volt supply range. Thus, $V_2$ is 12 Volts, and $V_1$ is 6 Volts. Table 3 below lists the various node voltages for the circuit illustrated in FIG. 4 in terms of the threshold voltages of the various intermediate transistors. The entries in Table 3 are the final node voltages achieved after all transistors have cut off in response to a change in the inputs. The threshold voltages for intermediate transistors $M_{N1}$, $M_{N1}'$, $M_{P1}$, $M_{P1}'$, $M_{N2}$, $M_{N2}'$, $M_{P2}$, and $M_{P2}'$ are $V_{TN1}$, $V_{TN1}'$, $V_{TP1}$, $V_{TP1}'$, $V_{TN2}$, $V_{TN2}'$, $V_{TP2}$, and $V_{TP2}'$, respectively.

TABLE 3

| VOLTAGE | IN = 3 V<br>IN = 0 V | IN = 0 V<br>IN = 3 V |
|---|---|---|
| $V_H$ | $V_H$ | $V_H$ |
| OUT | $V_2 + V_{TP2}$ | $V_H$ |
| A | $V_1 + V_{TP1}$ | $V_H$ |
| C | $V_1 + V_{TP1}$ | $V_2 - V_{TN2}$ |
| E | 0 | $V_2 - V_{TN2}$ |
| G | 0 | $V_1 - V_{TN1}$ |
| GND | 0 | 0 |
| $V_H$ | $V_H$ | VH |
| $\overline{\text{OUT}}$ | $V_H$ | $V_2 + V'_{TP2}$ |
| B | $V_H$ | $V_1 + V'_{TP1}$ |
| D | $V_2 - V'_{TN2}$ | $V_1 + V'_{TP1}$ |
| F | $V_2 - V'_{TN2}$ | 0 |
| H | $V_1 - V'_{TH1}$ | 0 |
| GND | 0 | 0 |

The node voltages for the side of the level shifter being pull down are determined by the cut off of the intermediate PMOS transistors. Similarly, the node voltages for the side of the level shifter being pulled up are determined by the cut off of the intermediate NMOS transistors.

As long as none of the vertically adjacent voltages in Table 3 are greater than the hot-switching limitation, the circuit of FIG. 4 operates correctly. However, in modern devices the threshold voltages are typically larger than 1 volt. Modern devices have threshold voltages of around 1.5 volts.

In a typical CMOS process, the PMOS transistors are fabricated in an N-type well which is biased so that the P/N junctions formed by the source/drain regions and the well are reverse-biased. This electrically isolates the PMOS transistors. The NMOS transistors must also be electrically isolated. However, instead of making a P-type well for the NMOS transistors, often the entire substrate is initially formed to be P-type so that NMOS transistors can be formed without a well. The P-type substrate is grounded so that N-type source or drain regions operating at ground or at positive voltages are electrically isolated.

The series connection of the transistors in the circuit 400 of FIG. 4 causes the threshold voltages of the NMOS transistors operating at higher source and drain voltages to increase. Under normal conditions when the gate to source voltage of an NMOS transistors is greater than the transistor threshold voltage, the depletion layers in the N-type source and the P-type substrate remain at a constant width and charge carriers are pulled into the channel from the source. However, as the level of source to substrate bias increases, the width of the channel-substrate depletion layer also increases, resulting in an increase in the density of the trapped carriers in the depletion layer. For charge neutrality to hold, the channel charge must decrease. The resultant effect is that the substrate voltage adds to the channel-substrate junction potential. This increases the gate-channel voltage drop. The overall effect is an increase in the threshold voltage of the device, and is called the body effect.

As can be seen from Table 3, the NMOS transistors $M_{N2}$ and $M_{N2}'$ operate at relatively high voltages, having a minimum source voltage one threshold above $V_1$ (6V), and having a maximum source voltage only one threshold voltage below $V_2$ (12V). Because the substrate is grounded, the body effect increases the threshold voltages $V_{tN2}$ and $V_{tN2}'$ of transistors $M_{N2}$ and $M_{N2}'$. For example, in a typical application the threshold voltages $V_{tN2}$ and $V_{tN2}'$ of transistors $M_{N2}$ and $M_{N2}'$ are about 2.0 Volts due to the body effect, and the threshold voltages $V_{tN1}$ and $V_{tN1}'$ of transistors $M_{N1}$ and $M_{N1}'$ are only about 1.5 Volts.

With these typical threshold values, hot switching occurs in several of the transistors. For example, as shown in Table 3, the voltage across transistor $M_{N2}$ when the input IN is low is shown by the difference between the voltages at nodes A and C. If $V_H$ is 18V, $V_2$ is 12V, and $V_{tN2}$ is 2V, then the voltage across transistor $M_{N2}$ is 8 Volts. If the input IN is driven high and input IN is driven low, hot switching will occur in transistor $M_{N2}$. In order to prevent hot switching from occurring, each voltage subrange must be made smaller, so that the maximum voltage $V_H$ is only 15 volts, and $V_1$ and $V_2$ are only 5V and 10V, respectively.

Furthermore, the area of the circuit in FIG. 4 is larger than is necessary because the voltage swings of the output nodes OUT and $\overline{\text{OUT}}$ and the internal nodes A, B, C, D, E, F, G, and H are limited by the threshold voltages of the intermediate transistors. This limits the current carrying capability of the transistors and requires larger transistors to accomplish a given switching speed. Specifically, the intermediate nodes C and D have minimum and maximum voltages which are defined by the cut off voltages of the intermediate transistors. These cut off voltages are determined by the intermediate transistors' threshold voltages. Node C's minimum and maximum voltages are reduced by the threshold voltages of transistors $M_{P1}$ and $M_{N2}$, respectively. Node D's minimum and maximum voltages are reduced by the threshold voltages of transistors $M_{P1}'$ and $M_{N2}'$, respectively. Because these internal node swings are smaller.

The drain to source current I in the three regions of operation of an MOSFET transistor are given below.

| | | |
|---|---|---|
| 0 | $V_{gs} - V_t \leq 0$ | Cutoff |
| $I = \beta\{(V_{gs} - V_t)V_{ds} - V_{ds}^2/2\}$ | $0 < V_{ds} < V_{gs} - V_t$ | Linear |
| $\beta/2 * (V_{gs} - V_t)^2$ | $0 < V_{gs} - V_t < V_{ds}$ | Saturation |

The linear and saturation regions are the ON regions in which the drain current is non-zero. In both of these regions, the drain current increases at least linearly with $V_{gs}-V_t$, which is the gate to source voltage $V_{gs}$ minus the threshold voltage $V_t$ of the transistor. In the linear region, the drain current I is also a strong function of the drain to source voltage $V_{ds}$.

Table 6 in the column labeled "SHARED BIAS" shows the magnitudes of the drain to source voltages ($V_{ds}$) and the gate to source minus threshold voltages ($V_{gs}-V_t$) for each of the intermediate transistors $M_{N1}$, $M_{P1}$, $M_{N2}$, and $M_{P2}$ on the pulldown side of the level shifter 400 in FIG. 4 during a transition of the non-inverting input IN from 0V to 3V. Table 6 also shows $V_{ds}$ and $V_{gs}-V_t$ for the pull up transistor $M_{PO}'$ during this transition. The SHARED BIAS column of Table 6 clearly shows that the magnitude of the drain to source voltage $V_{ds}$ for each transistor contains one negative term which represents the subtraction of a threshold voltage. Actually, $V_{ds}$ is pretty much the same and equals $V_H-V_2$ when the switch is switching. More importantly, the SHARED BIAS column of Table 6 shows that the magnitude of the gate to source minus threshold voltage $V_{gs}-V_t$ of each of the transistors contains at least one negative term which represents the subtraction of a threshold voltage. The intermediate transistors $M_{N2}$ and $M_{P1}$, which have both their sources and their drains connected to other intermediate transistors, have two negative threshold voltage terms in their gate to source minus threshold voltage expressions.

Table 6 is a simplified reference chart for demonstrating the adverse effect of the transistor threshold voltages on the switching speed of the circuit 400 of FIG. 4 according to the present invention. The voltages in Table 6 are given assuming that the transistors turn on in strong saturation sequentially. This is an approximation which is offered for illustration purposes. The actual circuit behavior is somewhat more complicated, but the explanation below illustrates the points relevant to the present invention. For example, the voltages in Table 6 assume that the circuit 400 of FIG. 4 is initially in a state in which the input IN is at zero volts, and the input $\overline{IN}$ is at 3 Volts. The various circuit node voltages for this initial state are given in the right hand column of Table 3. Then when the input IN is driven high and the inverted input $\overline{IN}$ is driven low, input transistor $M_{NI}$ is turned on in strong saturation while input transistor $M_{NI}'$ is operate in the linear region. Table 6 assumes that transistor $M_{NI}$ fully discharges node G prior to transistor $M_{N1}$ turning on in strong saturation. When node G is fully discharged, transistor $M_{NI}$ operates in its linear region, providing just enough current to supply transistor $M_{N1}$, which turns on in strong saturation under the operating parameters listed in Table 6. After transistor $M_{N1}$ has discharged node E in strong saturation, it operates in the linear region, and transistor $M_{P1}$ turns on in strong saturation. After PMOS transistor $M_{P1}$ discharges node C, it reaches the boundary between saturation and cut off. Transistors $M_{N2}$ and $M_{P2}$ are also sequentially turned on in strong saturation before reaching linear operation and the boundary between strong saturation and cut off, respectively. Thus, Table 6 assumes that initially all transistors are either in cut off or linear operation. Furthermore, Table 6 assumes that only one pulldown device is operating in strong saturation at any given time. The transistors turn on in strong saturation in the following order in response to the low to high transition of non-inverting input IN: $M_{NI}$, $M_{N1}$, $M_{N2}$, $M_{P2}$, $M_{PO}'$ (linear), $M_{P2}'$, $M_{N2}'$, $M_{P1}'$, $M_{N1}'$, and $M_{NI}'$. The cross-coupled pull up transistors $M_{PO}$ and $M_{PO}'$ are turned on simultaneously. All of the above transistors must turn on in strong saturation in the order listed above in response to a transition of input IN from 0V to 3V. Each transistor, after operating in strong saturation, then reaches a point at which it operates either in the linear region with essentially no drain to source voltage or at the boundary between cut off and saturation, at which $V_{gs}-V_t=0$. NMOS transistors which have just pulled their drains down and PMOS transistors which have just pulled their drains up operate in the linear region with small $V_{ds}$. NMOS transistors which have just pulled their source up and PMOS transistors which have just pulled their source down operate at the boundary between cut off and saturation with small $V_{gs}-V_t$. Thus, in the example above when IN goes high, transistors $M_{NI}$, $M_{N1}$, $M_{N2}$, $M_{P2}'$, and $M_{P1}'$, after operating in strong saturation, operate in the linear region; transistors $M_{P1}$, $M_{P2}$, $M_{N2}'$, and $M_{N1}'$ operate at the boundary between cut off and saturation after operating in strong saturation. The time required for a transistor to turn on in strong saturation and then reach either minimal $V_{ds}$ or minimal $V_{gs}-V_t$ is the switching time for that transistor. The total latency of the level shifter changing states is then defined as the sum of the switching times of all the transistors, because all of the transistors switch sequentially. Thus, the total latency through both chains of transistors determines the maximum operating frequency of the level shifter.

Table 6 shows the initial conditions as each transistor turns on assuming that the transistors turn on sequentially as discussed above. The primed corresponding transistors are not listed in Table 6 because the initial conditions are the same as for the corresponding non-primed transistor. For example, the $V_{gs}-V_t$ entry for transistor $M_{N2}'$ would be $V_2-V_1-V_{TP1}'-V_{TN2}'$, which is exactly correspondent to the conditions for transistor $M_{N2}$.

The above-described sequential turn on scenario is actually an approximation for the way the circuit actually operates, and is offered for explanation and illustration purposes. It is true that the transistors turn on in the order described above. It is also true that the transistors turn off in the order described above after the final node voltages are reached in response to a change in the input. However, typically several transistors (sometimes all of the transistors) are ON in strong saturation simultaneously. Furthermore, the drain to source and gate to source minus threshold voltages are not as high as shown in Table 6 when each of the transistors turns on in strong saturation. For example, intermediate transistor $M_{N1}$ turns on before input transistor $M_{NI}$ has fully discharged node G; therefore the drain to source and gate to source voltages of transistor $M_{N1}$ never are quite as high as shown in Table 6. However, Table 6 illustrates that the current drive strength of each transistor is limited by the intermediate transistors' threshold voltages.

Figure 5:
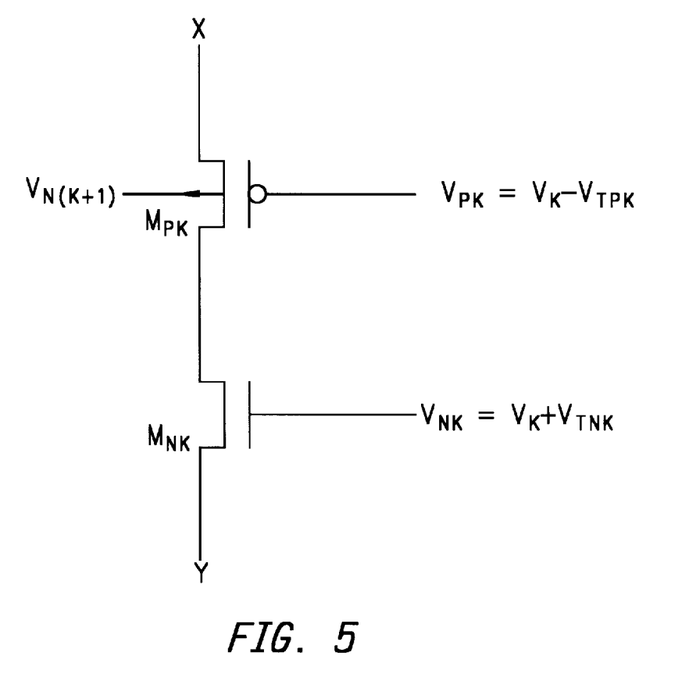
FIG. 5 illustrates an NMOS/PMOS series intermediate transistor pair for use in a split-bias embodiment of a high-voltage level shifter according to the present invention.

The current carrying capability of each transistor determines how quickly it can discharge each of the capacitances at the intermediate nodes. Because the current carrying capabilities of the transistors in FIG. 5 are reduced by the intermediate transistors' threshold voltages, in order to meet a minimum switching speed, the sizes of the transistors must be increased. Of course, as the sizes of the transistors are increased, the intermediate node capacitances also increase, thus requiring even larger transistors. These factors tend to yield a large area for the circuit 400 of FIG. 4 for a given switching speed. In addition, the maximum achievable switching speed is reduced.

FIG. 5 illustrates a pair of intermediate transistors according to an aspect of a split bias embodiment of the present invention. The difference between the split bias intermediate transistor pair of FIG. 5 and the shared bias intermediate transistor pair of FIG. 3 is in the bias voltages of the gates. In the split bias intermediate transistor pair, separate voltages are used to bias the gates of the PMOS and NMOS intermediate transistors. Specifically, the gate of the PMOS transistor $M_{PK}$ is biased at a lower voltage than the gate of the NMOS transistor $M_{NK}$. The PMOS transistor is biased at the intermediate voltage $V_K$ minus its threshold voltage $V_{TPK}$. Similarly, the NMOS transistor is biased at the intermediate voltage $V_K$ plus its threshold voltage $V_{TNK}$. Using this intermediate transistor pair, the minimum voltage at node X is $V_K$, and the maximum voltage at node Y is $V_K$. The ill effects of the transistors' threshold voltages are counteracted. Each voltage sub-range is fully usable with the split-bias transistor pair.

Figure 6:
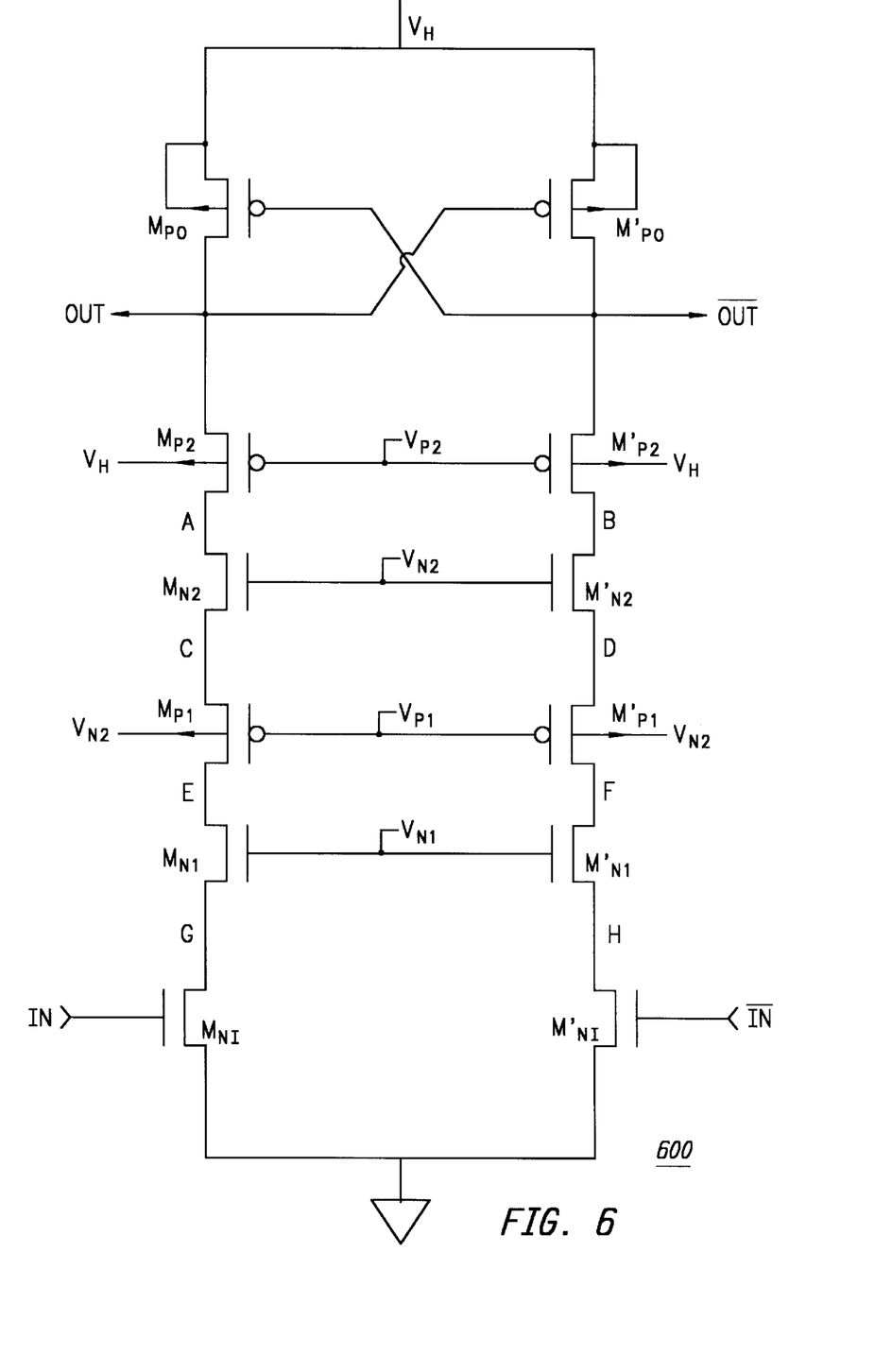
FIG. 6 illustrates a split-bias embodiment of a high-voltage level shifter according to the present invention having three voltage sub-ranges, two complementary NMOS/PMOS series intermediate transistor pairs, two NMOS bias voltages, and two PMOS bias voltages.

FIG. 6 illustrates a split bias embodiment 600 of the present invention using the split bias intermediate transistor pairs. In the embodiment 600 illustrated in FIG. 6, separate voltages are used to bias the gates of NMOS and PMOS intermediate transistors. Table 4 below shows the intermediate node voltages for the embodiment 600 of FIG. 6.

TABLE 4

| VOLTAGE | $\overline{IN} > V_{TN1}$<br>$IN < V_{TN1}$ | $\overline{IN} < V_{TN1}$<br>$IN > V_{TN1}$ |
|---|---|---|
| $V_H$ | $V_H$ | $V_H$ |
| OUT | $V_{P2} + V_{TP2}$ | $V_H$ |
| A | $V_{P1} + V_{TP1}$ | $V_H$ |
| C | $V_{P1} + V_{TP1}$ | $V_{N2} - V_{TN2}$ |
| E | 0 | $V_{N2} - V_{TN2}$ |
| G | 0 | $V_{N1} - V_{TN1}$ |
| GND | 0 | 0 |
| $V_H$ | $V_H$ | $V_H$ |
| OUT | $V_H$ | $V_{P2} + V'_{TP2}$ |
| B | $V_H$ | $V_{P1} + V'_{TP1}$ |
| D | $V_{N2} - V'_{TN2}$ | $V_{P1} + V'_{TP1}$ |
| F | $V_{N2} - V'_{TN2}$ | 0 |
| H | $V_{N1} - V'_{TN1}$ | 0 |
| GND | 0 | 0 |

In the preferred embodiment of the present invention, the intermediate nodes are biased so as to exactly counteract the effects of the transistor threshold voltages. However there is no requirement that these exact biases be used. For example, it may under certain circumstances be particularly easy to generate certain split bias voltages which differ from the intermediate voltages by less than the threshold voltages of the intermediate transistors. This achieves some of the benefit of using split-biasing without fully realizing the potential of the split-bias embodiment. Therefore, it is to be understood that the split bias embodiment of the present invention includes biasing the intermediate transistor pairs by two separate voltages which differ by any arbitrary amount up to and including the sum of the intermediate transistor thresholds.

The primed and non-primed transistors are all assumed to have the same threshold voltages. For example, $V_{TN2}=V_{TN2}'$. If $V_H=18V$, $V_2=12V$, $V_1=6V$, $V_{TN1}=V_{TP1}=V_{TP2}=1.5V$, and $V_{TN2}=2V$, then the following values are ideally used to bias the intermediate transistors according to the preferred embodiment of the present invention.

$$V_{N1}=V_1+V_{TN1}=7.5V$$

$$V_{P1}=V_1-V_{TP1}=4.5V$$

$$V_{N2}=V_2+V_{TN2}=14V$$

$$V_{P2}=V_2-V_{TP2}=10.5V$$

Table 5 below shows the intermediate and output node voltages for the preferred split-bias embodiment 600 illustrated in FIG. 6. The output node voltage swings shown in Table 5 for the preferred split-bias embodiment 600 illustrated in FIG. 6 are larger than in the embodiment 400 illustrated in FIG. 4 and described in Table 3. No threshold voltages enter into the intermediate node voltage expressions in Table 5.

TABLE 5

| VOLTAGE | IN = 3 V<br>$\overline{IN}$ = 0 V | IN = 0 V<br>$\overline{IN}$ = 3 V |
|---|---|---|
| $V_H$ | $V_H$ | $V_H$ |
| OUT | $V_2$ | $V_H$ |
| A | $V_1$ | $V_H$ |
| C | $V_1$ | $V_2$ |
| E | 0 | $V_2$ |
| G | 0 | $V_1$ |
| GND | 0 | 0 |
| $V_H$ | $V_H$ | $V_H$ |
| OUT | $V_H$ | $V_2$ |
| B | $V_H$ | $V_1$ |
| D | $V_2$ | $V_1$ |
| F | $V_2$ | 0 |
| H | $V_1$ | 0 |
| GND | 0 | 0 |

The SPLIT BIAS column of Table 6 below shows the drain to source and gate to source minus threshold voltages for the intermediate transistors of the split-bias embodiment 600 of FIG. 6. The same assumptions as stated above with regard to the SHARED BIAS column apply to the SPLIT BIAS column of Table 6. Specifically, the transistors are assumed to switch sequentially, and it is assumed that only one of the transistors is ON at any given time. As discussed above, these approximations are made for the sake of illustration, and are acknowledged to be simplifications of the actual circuit behavior.

TABLE 6

| | SHARED BIAS | SPLIT BIAS | DIFFERENCE |
|---|---|---|---|
| $M'_{P0}$ | | | |
| $\|V_{DS}\|$ | $V_H - V_2 - V'_{TP2}$ | $V_H - V_2$ | $V'_{TP2}$ |
| $\|V_{GS}\| - V_T$ | $V_H - V_2 - V_{TP2} - V'_{TP0}$ | $V_H - V_2 - V'_{TP0}$ | $V_{TP2}$ |
| $M_{P2}$ | | | |
| $\|V_{DS}\|$ | $V_H - V_1 - V'_{TP1}$ | $V_H - V_1$ | $V_{TP1}$ |
| $\|V_{GS}\| - V_T$ | $V_H - V_2 - V_{TP2}$ | $V_H - V_2$ | $V_{TP2}$ |
| $M_{N2}$ | | | |
| $\|V_{DS}\|$ | $V_H - V_1 - V_{TP1}$ | $V_H - V_1$ | $V_{TP1}$ |
| $\|V_{GS}\| - V_T$ | $V_2 - V_1 - V_{TP1} - V_{TN2}$ | $V_2 - V_1$ | $V_{TP1} + V_{TN2}$ |
| $M_{P1}$ | | | |
| $\|V_{DS}\|$ | $V_2 - V_{TN2}$ | $V_2$ | $V_{TN2}$ |
| $\|V_{GS}\| - V_T$ | $V_2 - V_1 - V_{TN2} - V_{TP1}$ | $V_2 - V_1$ | $V_{TN2} + V_{TP1}$ |
| $M_{N1}$ | | | |
| $\|V_{DS}\|$ | $V_2 - V_{TN2}$ | $V_2$ | $V_{TN2}$ |
| $\|V_{GS}\| - V_T$ | $V_1 - V_{TN1}$ | $V_1$ | $V_{TN1}$ |

The DIFFERENCE column of Table 6 shows the increase in the magnitude of the drain to source voltage $V_{ds}$ and increase in the gate to source minus threshold voltage $V_{gs}-V_t$ of the intermediate transistors which results when implementing the split bias embodiment rather than the shared bias embodiment of the present invention. These increases shown in the DIFFERENCE column of Table 6 demonstrate the increased current carrying capabilities of the transistors of the split bias embodiment when substituted into the MOSFET equations given above. Because each transistor is turned on more fully in the split bias embodiment, the pulldown transistors charge and discharge the intermediate and output nodes much more quickly, leading to a lower total latency of the node voltage transitions which must occur for the level shifter to change states.

Therefore, to achieve a given operating frequency, the split-bias high voltage level shifter according to the present invention uses a smaller circuit area than the shared bias level shifter embodiment of the present invention.

Generally, dividing the high voltage range VH into two or more equally sized sub-ranges is a simple and effective approach according to the present invention. However, there is no requirement according to the present invention that the size of the sub-ranges be equal. In other words, in the embodiment of FIG. 4, there is no requirement according to the present invention that $V_H-V_2=V_2-V_1=V_1$.

The number of sub-ranges according to the present invention may be extended to accommodate very high voltages. For example, using 6 volt sub-ranges, the number of sub-ranges may be increased to four to accommodate a 24 volt $V_H$. A straight-forward extension of the use of intermediate transistor pairs according to the present invention prevents violation of the hot-switching limitation. However, when extending the number of sub-ranges so as to accommodate very high voltages, care must be taken to insure that the junction breakdown voltage is not exceeded for the NMOS transistors. In the embodiments of FIGS. 4 and 6, the NMOS transistors are fabricated on a grounded P-type substrate. As higher supply voltages $V_H$ are used, the sources and drains of the intermediate NMOS transistors near the cross-coupled PMOS output transistors are maintained at higher voltages relative to ground.

Figure 7:
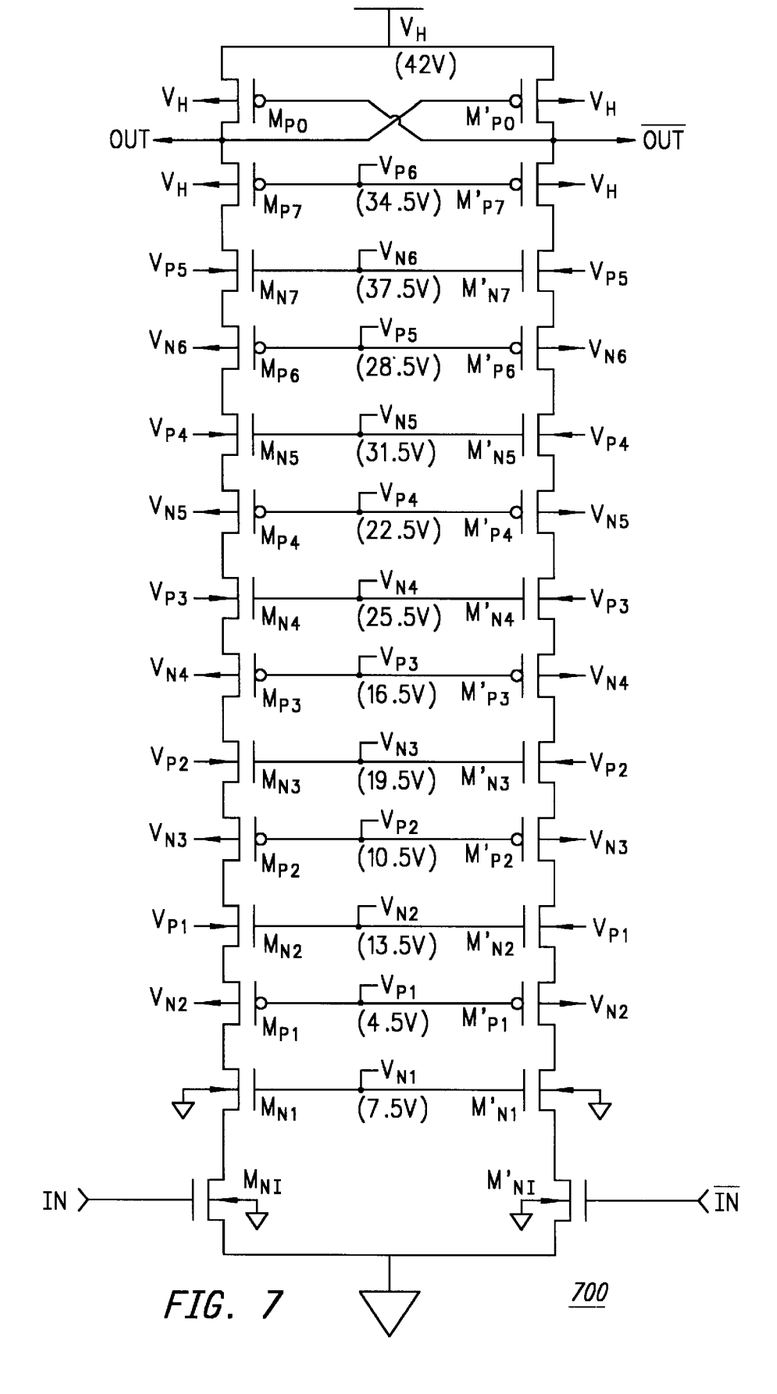
FIG. 7 illustrates a twin-tub split-bias embodiment of a high-voltage level shifter according to the present invention which minimizes the body effect for all intermediate transistors, and which has seven voltage sub-ranges, six complementary NMOS/PMOS series intermediate transistor pairs, six NMOS bias voltages, and six PMOS bias voltages.

FIG. 7 illustrates a twin-tub embodiment of the present invention which minimizes the body effect in the intermediate transistors and which is suitable for use in very high voltage applications. The junction breakdown voltage of an NMOS transistor biased by a fixed gate voltage and having its body tied to ground is roughly proportional to that fixed gate voltage by a factor of about 0.7. Thus, the gated diode breakdown voltage of a MOS transistor increases as the gate voltage increases. However at very high voltages, the junction breakdown constraint for NMOS devices having bodies tied to ground may be exceeded. By isolating the NMOS transistors in P-type wells, the bodies of the NMOS transistors can be tied to voltages which minimize the body effect with respect to those NMOS transistors. For example, the NMOS transistors $M_{N7}$ and $M_{N7}'$ in FIG. 7 have their bodies tied to the downwardly vertically adjacent PMOS bias voltage $V_{P6}$. Similar to the previous embodiments, the PMOS transistors have their bodies tied to the upwardly vertically adjacent NMOS bias voltages. The PMOS transistors having no upwardly vertically adjacent NMOS bias voltage are the highest intermediate transistors $M_{P7}$ and $M_{P7}'$ in FIG. 7; these PMOS transistors have their bodies tied to $V_H$, the high supply voltage. Similarly, the NMOS transistors having no downwardly vertically adjacent PMOS bias voltage are the intermediate transistors $M_{N1}$ and $M_{N1}'$; these NMOS transistors have their bodies tied to the ground supply voltage.

Because the source/drain to body voltage for the intermediate NMOS transistors in FIG. 7 are reduced, the body effect is reduced especially for the higher voltage NMOS transistors. For example, in the single-tub split-bias embodiment 600 in FIG. 6, NMOS transistors $M_{N2}$ and $M_{N2}'$ have threshold voltages of about 2.0 Volts due to the body effect while transistors $M_{N1}$ and $M_{N1}'$ have threshold voltages of only about 1.5 Volts. In contrast, in the twin-tub split-bias embodiment 700 illustrated in FIG. 7, the NMOS transistors $M_{N2}$ and $M_{N2}'$ have threshold voltages of only about 1.5 Volts. More importantly, the higher voltage NMOS transistors ($M_{N3}$, $M_{N3}'$, $M_{N4}$, $M_{N4}'$, $M_{N5}$, $M_{N5}'$, $M_{N6}$, $M_{N6}'$, $M_{N7}$, and $M_{N7}'$), have essentially no body effect component to their threshold voltages and do not violate the junction breakdown voltage constraint.

Each set of four transistors, for example, $M_{N1}$, $M_{N1}'$, $M_{P1}$, and $M_{P1}'$, constitute a complementary NMOS/PMOS series intermediate transistor pair. All of the intermediate transistors taken as a whole ($M_{N1}-M_{N7}$, $M_{N1}'-M_{N7}'$, $M_{P1}-M_{P7}$, and $M_{P1}'-M_{P7}'$ connected as shown in FIG. 7) constitute a plurality of complementary NMOS/PMOS series intermediate transistor pairs connected in series. Referring to the example in FIG. 7, the NMOS non-inverted intermediate source of the plurality is the source of $M_{N1}$; the NMOS inverted intermediate source of the plurality is the source of $M_{N1}'$; the PMOS non-inverted intermediate source of the plurality is the source of $M_{P7}$; and the PMOS inverted intermediate source of the plurality is the source of $M_{P7}'$. Each complementary NMOS/PMOS series intermediate transistor pair has an inverted NMOS gate, a non-inverted NMOS gate, an inverted PMOS gate, and a non-inverted PMOS gate. For the complementary NMOS/PMOS series intermediate transistor pair consisting of transistors $M_{N1}$, $M_{N1}'$, $M_{P1}$, and $M_{P1}'$, the inverted NMOS gate is the gate of $M_{N1}'$; the non-inverted NMOS gate is the gate of $M_{N1}$; the inverted PMOS gate is the gate of $M_{P1}'$; and the non-inverted PMOS gate is the gate of $M_{P1}$.

In the shared-bias embodiments such as illustrated in FIG. 4, the plurality of complementary NMOS/PMOS series intermediate transistor pairs has a corresponding plurality of intermediate voltages. For the example in FIG. 4, the intermediate voltages $V_1$ and $V_2$ correspond to the two complementary NMOS/PMOS series intermediate transistor pairs. $V_1$ corresponds to the complementary NMOS/PMOS series intermediate transistor pair consisting of transistors $M_{N1}$, $M_{N1}'$, $M_{P1}$, and $M_{P1}'$, while $V_2$ corresponds to the complementary NMOS/PMOS series intermediate transistor pair consisting of transistors $M_{N2}$, $M_{N2}'$, $M_{P2}$, and $M_{P2}'$. The intermediate voltages are monotonically increasing along the plurality of complementary NMOS/PMOS series intermediate transistor pairs because $V_2$ is greater than $V_1$.

In the split-bias embodiments such as illustrated in FIGS. 6 and 7, a plurality of NMOS bias voltages and a plurality of PMOS bias voltages correspond to the plurality of complementary NMOS/PMOS series intermediate transistor pairs. In other words, each complementary NMOS/PMOS series intermediate transistor pair has both an NMOS bias voltage and a PMOS bias voltage which corresponds to it. In FIG. 6, the NMOS bias voltage $V_{N1}$ and the PMOS bias voltage $V_{P1}$ correspond to the complementary NMOS/PMOS series intermediate transistor pair consisting of transistors $M_{N1}$, $M_{N1}'$, $M_{P1}$, and $M_{P1}'$.

In all of the embodiments of the present invention, the intermediate voltages are connected only to the gates or to the gates and wells of the intermediate transistors. The gates of MOS transistors conduct no static current, and the wells are isolated by reverse-biased diode junctions which conduct negligible static leakage current. Because the total current which must be supplied by the intermediate voltages is negligible, a simple voltage divider can be used to generate the intermediate voltages from the high voltage. High resistances can be used in the voltage divider so that very little power is sourced from the high voltage supply.

Although the N-wells of the PMOS intermediate transistors are biased using other intermediate voltages in order to minimize the body effect for the PMOS transistors, there is no requirement according to the present invention that intermediate voltages be used. For example, the high voltage $V_H$ can be used to bias all N-wells at the expense of increased body effect for the lower voltage PMOS intermediate transistors.

Although the voltage sub-ranges have been described and illustrated as being equal to each other, there is no requirement according to the present invention that the sub-ranges be equal in voltage. For example, a 16 volt high voltage range could be separated into two 5 volt sub-ranges and one 6 volt sub-range rather than three 5-and-⅓ volt sub-ranges.

While the present invention has been described in conjunction with several alternative embodiments, these embodiments are offered by way of illustration rather than by way of limitation. Those skilled in the art will be enabled by this disclosure to make various modifications and alterations to the embodiments described without departing from the spirit and scope of the present invention. Accordingly, these modifications and alterations are deemed to lie within the spirit and scope of the present invention as specified by the appended claims.

What is claimed is:

1. A high-voltage level shifter, comprising:
   an NMOS non-inverted input transistor having a source, drain, and gate;
   an NMOS inverted input transistor having a source, drain, and gate;
   a first NMOS non-inverted intermediate transistor having a source, drain, and gate;
   a first PMOS non-inverted intermediate transistor having a source, drain, and gate;
   a first NMOS inverted intermediate transistor having a source, drain, and gate;
   a first PMOS inverted intermediate transistor having a source, drain, and gate;
   wherein the NMOS non-inverted input transistor drain is coupled to the first NMOS non-inverted intermediate transistor source; wherein the first NMOS non-inverted intermediate transistor drain is coupled to the first PMOS non-inverted intermediate transistor drain; wherein the NMOS inverted input transistor drain is coupled to the first NMOS inverted intermediate transistor source; wherein the first NMOS inverted intermediate transistor drain is coupled to the first PMOS inverted intermediate transistor drain;
   wherein the first NMOS non-inverted intermediate transistor gate, the first PMOS non-inverted intermediate transistor gate, the first NMOS inverted intermediate transistor gate, and the first PMOS inverted intermediate transistor gate are coupled to a first intermediate voltage that is lower than a high positive supply voltage;
   a second NMOS non-inverted intermediate transistor having a source, drain, and gate;
   a second PMOS non-inverted intermediate transistor having a source, drain, and gate;
   a second NMOS inverted intermediate transistor having a source, drain, and gate; and
   a second PMOS inverted intermediate transistor having a source, drain, and gate;
   wherein the second NMOS non-inverted intermediate transistor source is coupled to the first PMOS non-inverted intermediate transistor source; wherein the second NMOS inverted intermediate transistor source is coupled to the first PMOS inverted intermediate transistor source; wherein the second PMOS non-inverted intermediate transistor drain is coupled to the second NMOS non-inverted transistor drain; wherein the second PMOS inverted intermediate transistor drain is coupled to the second NMOS inverted transistor drain; and wherein the second NMOS non-inverted intermediate transistor gate, the second PMOS non-inverted intermediate transistor gate, the second NMOS inverted intermediate transistor gate, and the second PMOS inverted intermediate transistor gate are coupled to a second intermediate voltage that is higher than the first intermediate voltage and lower than the high positive supply voltage.

2. A high-voltage level shifter as in claim 1, further comprising:
   a PMOS non-inverted output transistor having a source, drain, and gate; and
   a PMOS inverted output transistor having a source, drain, and gate;
   wherein the PMOS non-inverted output transistor drain is coupled to the second PMOS non-inverted intermediate transistor source; wherein the PMOS inverted output transistor drain is coupled to the second PMOS inverted intermediate transistor source.

3. A high-voltage level shifter as in claim 2,
   wherein the second intermediate voltage is coupled to a first PMOS non-inverted intermediate transistor's body and a first PMOS inverted intermediate transistor's body.

4. A high-voltage level shifter, comprising:
   an NMOS non-inverted input transistor having a source, drain, and gate;
   an NMOS inverted input transistor having a source, drain, and gate;
   a first NMOS non-inverted intermediate transistor having a source, drain, and gate;
   a first PMOS non-inverted intermediate transistor having a source, drain, and gate;
   a first NMOS inverted intermediate transistor having a source, drain, and gate;
   a first PMOS inverted intermediate transistor having a source, drain, and gate;
   wherein the NMOS non-inverted input transistor drain is coupled to the first NMOS non-inverted intermediate transistor source; wherein the first NMOS non-inverted intermediate transistor drain is coupled to the first PMOS non-inverted intermediate transistor drain; wherein the NMOS inverted input transistor drain is coupled to the first NMOS inverted intermediate transistor source; wherein the first NMOS inverted intermediate transistor drain is coupled to the first PMOS inverted intermediate transistor drain;
   wherein the first NMOS non-inverted intermediate transistor gate and the first NMOS inverted intermediate transistor gate are coupled to a first n-bias intermediate voltage; wherein the first PMOS non-inverted intermediate transistor gate and the first PMOS inverted intermediate transistor gate are coupled to a first p-bias intermediate voltage;
   wherein the first n-bias intermediate voltage is higher than the first p-bias intermediate voltage; wherein both the first n-bias and the first p-bias intermediate voltages are lower than a high positive supply voltage;
   a second NMOS non-inverted intermediate transistor having a source, drain, and gate;
   a second PMOS non-inverted intermediate transistor having a source, drain, and gate;
   a second NMOS inverted intermediate transistor having a source, drain, and gate; and a second PMOS inverted intermediate transistor having a source, drain, and gate;

wherein the second NMOS non-inverted intermediate transistor source is coupled to the first PMOS non-inverted intermediate transistor source; wherein the second NMOS inverted intermediate transistor source is coupled to the first PMOS inverted intermediate transistor source; wherein the second PMOS non-inverted intermediate transistor drain is coupled to the second NMOS non-inverted transistor drain; wherein the second PMOS inverted intermediate transistor drain is coupled to the second NMOS inverted transistor drain;

wherein the second NMOS non-inverted intermediate transistor gate and the second NMOS inverted intermediate transistor gate are coupled to a second n-bias intermediate voltage; wherein the second PMOS non-inverted intermediate transistor gate and the second PMOS inverted intermediate transistor gate are coupled to a second p-bias intermediate voltage;

wherein the second n-bias intermediate voltage is higher than the second p-bias intermediate voltage; wherein both the second n-bias intermediate voltage and the second p-bias intermediate voltage are higher than the first n-bias intermediate voltage and first p-bias intermediate voltage; and wherein both the second n-bias intermediate voltage and the second p-bias intermediate voltage are lower than the high positive supply voltage.

5. A high-voltage level shifter as in claim 4, further comprising:

a PMOS non-inverted output transistor having a source, drain, and gate; and a PMOS inverted output transistor having a source, drain, and gate;

wherein the PMOS non-inverted output transistor drain is coupled to the second PMOS non-inverted intermediate transistor source; wherein the PMOS inverted output transistor drain is coupled to the second PMOS inverted intermediate transistor source.

6. A high-voltage level shifter as in claim 5, wherein the second n-bias intermediate voltage is coupled to a first PMOS non-inverted intermediate transistor's body and a first PMOS inverted intermediate transistor's body.

7. A high-voltage level shifter, comprising:

an NMOS non-inverted input transistor having a source, drain, and gate;

an NMOS inverted input transistor having a source, drain, and gate;

a plurality of complementary NMOS/PMOS series intermediate transistor pairs connected in series, comprising:

an upper complementary NMOS/PMOS series intermediate transistor pair having an upper non-inverted NMOS gate, an upper non-inverted PMOS gate, an upper inverted NMOS gate, an upper inverted PMOS gate, a PMOS inverted intermediate source, and a PMOS non-inverted intermediate source, wherein the upper non-inverted NMOS gate and the upper inverted NMOS gate are coupled to an upper NMOS bias voltage; wherein the non-inverted PMOS gate and the inverted PMOS gate are coupled to an upper PMOS bias voltage: and a lower complementary NMOS/PMOS series intermediate transistor pair having a lower non-inverted NMOS gate, a lower non-inverted PMOS gate, a lower inverted NMOS gate, a lower inverted PMOS gate, an NMOS inverted intermediate source, and an NMOS non-inverted intermediate source, wherein the lower non-inverted NMOS gate and the lower inverted NMOS gate are coupled to a lower NMOS bias voltage; wherein the non-inverted PMOS gate and the inverted PMOS gate are coupled to a lower PMOS bias voltage;

wherein the NMOS non-inverted input transistor drain is coupled to the lower NMOS non-inverted intermediate source; wherein the NMOS inverted input transistor drain is coupled to the lower NMOS inverted intermediate source.

8. A high-voltage level shifter as in claim 7, further comprising:

a PMOS non-inverted output transistor having a source, drain, and gate; and a PMOS inverted output transistor having a source, drain, and gate;

wherein the PMOS non-inverted output transistor drain is coupled to the PMOS non-inverted intermediate source; wherein the PMOS inverted output transistor drain is coupled to the PMOS inverted intermediate source;

wherein the PMOS non-inverted output transistor drain is coupled to the PMOS inverted output transistor gate; and wherein the PMOS inverted output transistor drain is coupled to the PMOS non-inverted output transistor gate.

9. A high-voltage level shifter as in claim 8, wherein the PMOS non-inverted output transistor source and the PMOS inverted output transistor source are coupled to the high positive supply voltage; and wherein the NMOS non-inverted input transistor source and the NMOS inverted input transistor source are coupled to a ground supply voltage.

10. A high-voltage level shifter as in claim 8, wherein a non-inverted input is coupled to the NMOS non-inverted input transistor gate; wherein an inverted input is coupled to the NMOS inverted input transistor gate; wherein a non-inverted output is coupled to the non-inverted output transistor drain; and wherein an inverted output is coupled to the inverted output transistor drain.

11. A high-voltage level shifter as in claim 7, wherein an upper intermediate voltage is coupled to the upper NMOS bias voltage and the upper PMOS bias voltage; and wherein a lower intermediate voltage is coupled to the lower NMOS bias voltage and the lower PMOS bias voltage.

12. A high-voltage level shifter as in claim 11, wherein the upper intermediate voltage is greater than the lower intermediate voltage.

13. A high-voltage level shifter as in claim 7, wherein the upper NMOS bias voltage is greater than the upper PMOS bias voltage, and the lower NMOS bias voltage is greater than the lower PMOS bias voltage.

14. A high-voltage level shifter as in claim 13, wherein the upper NMOS bias voltage is greater than the upper PMOS bias voltage by an N-type transistor threshold voltage plus a P-type transistor threshold voltage, and wherein the lower NMOS bias voltage is greater than the lower PMOS bias voltage by the N-type transistor threshold voltage plus the P-type transistor threshold voltage.

15. A high-voltage level shifter as in claim 14, wherein the upper NMOS bias voltage is greater than the lower NMOS bias voltage, and wherein the upper PMOS bias voltage is greater than the lower PMOS bias voltage.

16. A high-voltage level shifter, comprising:

an NMOS non-inverted input transistor having a source, drain, and gate;

an NMOS inverted input transistor having a source, drain, and gate;

a plurality of complementary NMOS/PMOS series intermediate transistor pairs connected in series, such that the plurality has an NMOS non-inverted intermediate source, an NMOS inverted intermediate source, a PMOS non-inverted intermediate source, a PMOS inverted intermediate source, wherein each said complementary NMOS/PMOS series intermediate transistor pair in the plurality has a non-inverted NMOS gate, a non-inverted PMOS gate, an inverted NMOS gate, and an inverted PMOS gate;

wherein the NMOS non-inverted input transistor drain is coupled to the NMOS non-inverted intermediate source; wherein the NMOS inverted input transistor drain is coupled to the NMOS inverted intermediate source;

wherein the non-inverted NMOS gate and the inverted NMOS gate in each said complementary NMOS/PMOS series intermediate transistor pair are coupled to a corresponding NMOS bias voltage; wherein the non-inverted PMOS gate and the inverted PMOS gate in each said complementary NMOS/PMOS series intermediate transistor pair are coupled to a corresponding PMOS bias voltage;

wherein each said complementary NMOS/PMOS series intermediate transistor pair having a higher-voltage vertically adjacent NMOS/PMOS series intermediate transistor pair includes a P-body which is connected to an upwardly vertically adjacent NMOS bias voltage.

17. A high-voltage level shifter as in claim 16, wherein each said complementary NMOS/PMOS series intermediate transistor pair having a lower-voltage vertically adjacent NMOS/PMOS series intermediate transistor pair includes an N-body which is connected to a downwardly vertically adjacent PMOS bias voltage.

\* \* \* \* \*

UNITED STATES PATENT AND TRADEMARK OFFICE
CERTIFICATE OF CORRECTION

PATENT NO. : 5,821,800
DATED     : October 13, 1998
INVENTOR(S) : Binh Quang Le, Shoichi Kawamura, Pau-Ling Chen, Shane Hollmer It is certified that error appears in the above-indentified patent and that said Letters Patent is hereby corrected as shown below:

On the title page, item[73] Assignee: Advanced Micro Devices, Inc., Sunnyvale, Calif.", please insert -- , and Fujitsu Limited, Kanagawa-Ken, Japan --.

Signed and Sealed this

Sixth Day of April, 1999

*Attest:*

Q. TODD DICKINSON

*Attesting Officer*   *Acting Commissioner of Patents and Trademarks*